US011158564B1

(12) United States Patent
Yatskov et al.

(10) Patent No.: US 11,158,564 B1
(45) Date of Patent: Oct. 26, 2021

(54) APPARATUS, SYSTEM, AND METHOD FOR DYNAMIC COMPENSATION OF HEATSINK-CLAMPING MECHANISMS

(71) Applicant: Juniper Networks, Inc., Sunnyvale, CA (US)

(72) Inventors: Alexander I. Yatskov, Manteca, CA (US); Elmer Tolentino, Livermore, CA (US); Gautam Ganguly, San Jose, CA (US); Jimmy Chun-Chuen Leung, Fremont, CA (US)

(73) Assignee: Juniper Networks, Inc, Sunnyvale, CA (US)

( * ) Notice: Subject to any disclaimer, the term of this patent is extended or adjusted under 35 U.S.C. 154(b) by 0 days.

(21) Appl. No.: 17/135,133

(22) Filed: Dec. 28, 2020

Related U.S. Application Data

(63) Continuation of application No. 16/526,847, filed on Jul. 30, 2019, now Pat. No. 10,943,848.

(51) Int. Cl.
*H05K 7/20* (2006.01)
*H01L 23/40* (2006.01)
*F28F 13/00* (2006.01)

(52) U.S. Cl.
CPC .......... *H01L 23/4006* (2013.01); *F28F 13/00* (2013.01); *F28F 2013/005* (2013.01); *F28F 2013/006* (2013.01); *H01L 2023/4043* (2013.01); *H01L 2023/4062* (2013.01); *H01L 2023/4081* (2013.01); *H01L 2023/4087* (2013.01); *H05K 7/20154* (2013.01)

(58) Field of Classification Search
CPC ......... H01L 23/4006; H01L 2023/4043; H01L 2023/4062; H01L 2023/4081; H01L 2023/4087; H05K 7/20154; G06F 1/20–206; F28F 13/00; F28F 2013/005; F28F 2013/006
See application file for complete search history.

(56) References Cited

U.S. PATENT DOCUMENTS

| 2004/0132331 | A1 | 7/2004 | Osborn et al. |
| 2006/0275100 | A1 | 12/2006 | Aukzemas |
| 2008/0197483 | A1 | 8/2008 | Ouyang |
| 2008/0310118 | A1* | 12/2008 | Brocklesby ............. H01L 21/50 361/719 |
| 2009/0266512 | A1* | 10/2009 | Lu ....................... H01L 23/4006 165/80.3 |

(Continued)

OTHER PUBLICATIONS

Non-Final Office Action received for U.S. Appl. No. 16/526,847 dated Sep. 4, 2020, 20 pages.

(Continued)

*Primary Examiner* — Jacob R Crum
(74) *Attorney, Agent, or Firm* — FisherBroyles, LLP (57) ABSTRACT

The disclosed apparatus may include (1) a shoulder bolt that includes (A) a head and (B) a shank, (2) a retention barrel that envelops at least a portion of the shank of the shoulder bolt, (3) a coil spring that envelops at least a portion of the shank of the shoulder bolt and resides between the head of the shoulder bolt and a heatsink, and (4) a travel-limiting component (such as a set screw or a sleeve) that (A) is coupled to the retention barrel and (B) limits the heatsink from travelling linearly beyond a travel threshold via the coil spring. Various other apparatuses, systems, and methods are also disclosed.

20 Claims, 10 Drawing Sheets

(56) References Cited

U.S. PATENT DOCUMENTS

| | | | |
|---|---|---|---|
| 2009/0308574 A1* | 12/2009 | Liu | H01L 23/4006 165/80.3 |
| 2010/0000715 A1* | 1/2010 | Zheng | H01L 23/467 165/80.3 |
| 2011/0038125 A1* | 2/2011 | Cao | H01L 23/4006 361/720 |
| 2011/0235280 A1* | 9/2011 | Hsieh | H01L 23/4006 361/720 |
| 2012/0092826 A1 | 4/2012 | Heidepriem et al. | |
| 2012/0160976 A1 | 6/2012 | Ye | |
| 2012/0188723 A1 | 7/2012 | Liu et al. | |
| 2013/0146252 A1 | 6/2013 | Yang | |
| 2013/0156525 A1 | 6/2013 | Gill et al. | |
| 2013/0189049 A1 | 7/2013 | Stotz, Jr. | |
| 2014/0000855 A1* | 1/2014 | Xia | H01L 23/4006 165/185 |
| 2015/0194367 A1 | 7/2015 | Grosskreuz et al. | |

OTHER PUBLICATIONS

Notice of Allowance received for U.S. Appl. No. 16/526,847 dated Nov. 18, 2020, 22 pages.

* cited by examiner

APPARATUS, SYSTEM, AND METHOD FOR DYNAMIC COMPENSATION OF HEATSINK-CLAMPING MECHANISMS

CROSS REFERENCE TO RELATED APPLICATION

This application is a continuation of U.S. application Ser. No. 16/526,847 filed 30 Jul. 2019, the disclosure of which is incorporated in its entirety by this reference.

BACKGROUND

Heatsinks are often a critical factor for electronic and mechanical devices. For example, a telecommunications device (such as a router or switch) may include circuit boards with electronic components that generate heat during operation, thereby causing the operating temperatures of those electronic components and/or neighboring components to rise. If the operating temperatures rise above a certain level, such components may overheat, malfunction, or even break. To prevent such issues, many electronic components may be equipped with heatsinks designed to transfer and/or dissipate heat. The heatsinks may include thermally conductive material that transfers heat away from the electronic components, thereby cooling the electronic components and/or enabling them to achieve higher performance.

Unfortunately, heatsinks may also introduce certain risks into telecommunications devices. For example, because the performance of heatsinks is generally commensurate with its size, a high-performing heatsink may be relatively heavy and/or represent a heavy load that is pressed against an electronic component soldered to a circuit board. In the event that the telecommunications device experiences a sudden jolt and/or drop (e.g., during shipping), the heatsink may place enough stress and/or force on the electronic component and/or the circuit board to damage certain solder joints connecting the electronic component to the circuit board. As a result, the telecommunications device may no longer function properly.

To address this concern, heatsinks may be secured to circuit boards by spring-loaded clamping mechanisms. These spring-loaded clamping mechanisms may ease the burden placed on electronic components when telecommunications devices are moved, shipped, or even dropped. However, while the amount of pressure and/or travel allowed by these spring-loaded clamping mechanisms may prevent damage during certain motion-based activities, the same amount of pressure and/or travel may be inadequate for ensuring strong thermal couplings between heatsinks and corresponding electronic components.

The instant disclosure, therefore, identifies and addresses a need for additional and improved apparatuses, systems, and methods for dynamic compensation of heatsink-clamping mechanisms.

SUMMARY

As will be described in greater detail below, the instant disclosure generally relates to apparatuses, systems, and methods for dynamic compensation of heatsink-clamping mechanisms. In one example, an apparatus for accomplishing such a task may include (1) a shoulder bolt that includes (A) a head and (B) a shank, (2) a retention barrel that envelops at least a portion of the shank of the shoulder bolt, (3) a coil spring that envelops at least a portion of the shank of the shoulder bolt and resides between the head of the shoulder bolt and a heatsink, and (4) a travel-limiting component (such as a set screw or a sleeve) that (A) is coupled to the retention barrel and (B) limits the heatsink from travelling linearly beyond a travel threshold via the coil spring.

Similarly, a system for accomplishing such a task may include (1) a heatsink and (2) a spring-loaded clamping mechanism for securing the heatsink to an electronic component included on a circuit board, wherein the spring-loaded clamping mechanism comprises (A) a shoulder bolt coupled to the heatsink, wherein the shoulder bolt includes (1) a head and (11) a shank, (B) a retention barrel that envelops at least a portion of the shank of the shoulder bolt, (C) a coil spring that envelops at least a portion of the shank of the shoulder bolt and resides between the head of the shoulder bolt and a heatsink, and (D) a travel-limiting component (such as a set screw or a sleeve) that (1) is coupled to the retention barrel and (II) limits the heatsink from travelling linearly beyond a travel threshold via the coil spring.

A corresponding method may include (1) assembling a spring-loaded clamping mechanism by (A) placing a coil spring over at least a portion of a shoulder bolt, (B) placing a retention barrel over at least a portion of the shoulder bolt such that the coil spring resides between a head of the shoulder bolt and a heatsink, (C) coupling a travel-limiting component (such as a set screw or a sleeve) to the retention barrel such that the retention barrel limits the heatsink from travelling linearly beyond a travel threshold via the coil spring, (2) coupling the spring-loaded clamping mechanism to the heatsink, and (3) mounting the heatsink to one side of a circuit board by way of the spring-loaded clamping mechanism by attaching the spring-loaded clamping mechanism to a backplate positioned on an opposite side of the circuit board.

Features from any of the above-mentioned embodiments may be used in combination with one another in accordance with the general principles described herein. These and other embodiments, features, and advantages will be more fully understood upon reading the following detailed description in conjunction with the accompanying drawings and claims.

BRIEF DESCRIPTION OF THE DRAWINGS

The accompanying drawings illustrate a number of exemplary embodiments and are a part of the specification. Together with the following description, these drawings demonstrate and explain various principles of the instant disclosure.

Throughout the drawings, identical reference characters and descriptions indicate similar, but not necessarily identical, elements. While the exemplary embodiments described herein are susceptible to various modifications and alternative forms, specific embodiments have been shown by way of example in the drawings and will be described in detail herein. However, the exemplary embodiments described herein are not intended to be limited to the particular forms disclosed. Rather, the instant disclosure covers all modifications, equivalents, and alternatives falling within the scope of the appended claims.

DETAILED DESCRIPTION OF EXEMPLARY EMBODIMENTS

The present disclosure describes various apparatuses, systems, and methods for dynamic compensation of heatsink-clamping mechanisms. As will be explained in greater detail below, the apparatuses, systems, and methods described herein may provide various advantages and/or benefits over traditional heatsink-clamping technologies. For example, embodiments of the instant disclosure may facilitate and/or provide different settings and/or configurations for heatsink-clamping mechanisms. By doing so, these embodiments may enable spring-loaded clamping mechanisms to achieve increased levels of pressure to satisfy the high thermal performance demands of telecommunications devices during operation while also achieving decreased levels of pressure to account and/or compensate for inadvertent drops and/or vibrations during shipping and/or handling.

The following will provide, with reference to FIG. 1-9, detailed descriptions of an exemplary apparatuses, systems, configurations, and/or implementations for dynamic compensation of heatsink-clamping mechanisms. In addition, the discussion corresponding to FIG. 10 will provide a detailed description of an exemplary method for dynamic compensation of heatsink-clamping mechanisms.

Figure 1:
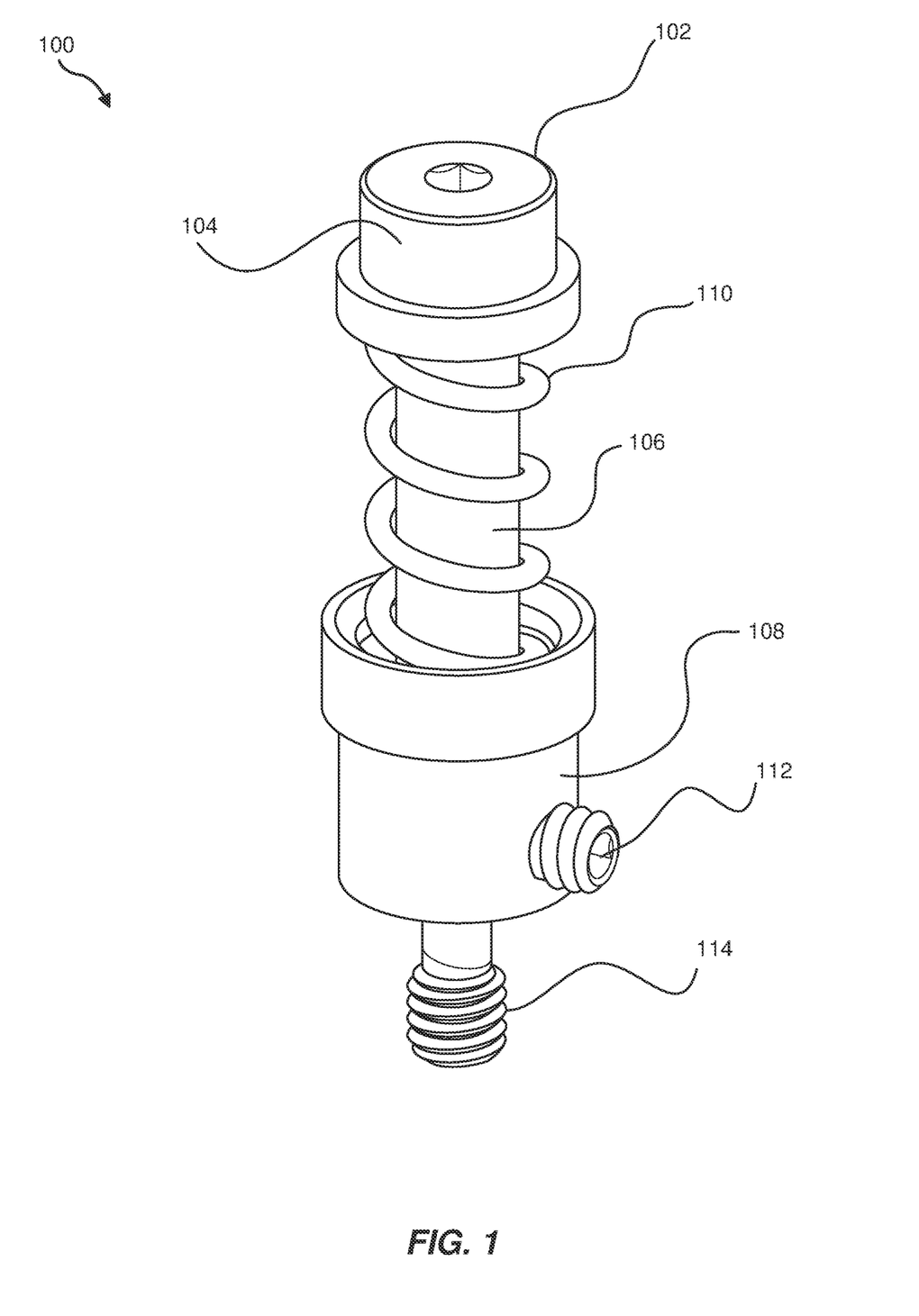
FIG. 1 is an illustration of an exemplary apparatus for dynamic compensation of heatsink-clamping mechanisms.

FIG. 1 illustrates an exemplary apparatus 100 for dynamic compensation of heatsink-clamping mechanisms. As illustrated in FIG. 1, exemplary apparatus 100 may include and/or represent a spring-loaded clamping mechanism. As will be described in greater detail below, apparatus 100 may be implemented and/or used to secure a heatsink to an electronic component included on a circuit board.

In some examples, apparatus 100 may include and/or represent a shoulder bolt 102, a retention barrel 108, a coil spring 110, and a travel-limiting component 112. In one example, shoulder bolt 102 may include and/or represent any type or form of physical member against which retention barrel 108 (or a heatsink) compresses coil spring 110 as part of a spring-loaded clamping mechanism. In other words, coil spring 110 may reside and/or be compressed between a flange or head of shoulder bolt 102 and retention barrel 108 (or a heatsink). In one example, shoulder bolt 102 may include and/or represent a screw with a thread that is inserted and/or installed into a circuit board. Additional examples of shoulder bolt 102 include, without limitation, members, pegs, pins, arms, bolts, screws, fasteners, combinations of one or more of the same, and/or any other suitable shoulder bolt.

In some examples, shoulder bolt 102 may include and/or represent a variety of different sections, segments, and/or areas with distinct purposes and/or functions. For example, shoulder bolt 102 may include and/or represent a head 104, a shank 106, and/or a thread 114. In one example, head 104 of shoulder bolt 102 may serve and/or function as a flange, lip, and/or rim. In this example, head 104 of shoulder bolt 102 may, together with retention barrel 108 (or a heatsink), hold coil spring 110 in place and/or compress coil spring 110. Additionally or alternatively, head 104 may include and/or provide a fitting and/or groove that serves to drive and/or screw shoulder bolt 102 into a threaded hole.

Shoulder bolt 102 may be of any suitable sizes, dimensions, and/or shapes. In addition, shoulder bolt 102 may include and/or contain any of a variety of materials. Examples of such materials include, without limitation, metals, plastics, ceramics, polymers, composites, combinations or variations of one or more of the same, and/or any other suitable materials.

In some examples, retention barrel 108 may include and/or represent a full or partial casing, sheath, cover, and/or enclosure. In such examples, retention barrel 108 may include and/or form a hole, channel, and/or opening. In one example, the hole, channel, and/or opening may be fitted to accept shoulder bolt 102. In this example, the hole, channel, and/or opening may be created and/or formed by a wall, band, and/or ring that runs and/or composes the perimeter or boundary of retention barrel 108.

As illustrated in FIG. 1, shoulder bolt 102 may pass through the hole, channel, and/or opening in retention barrel 108. In one example, retention barrel 108 may slide or move axially and/or linearly relative to shoulder bolt 102. For example, retention barrel 108 may slide and/or move up relative to shoulder bolt 102 to compress coil spring 110. Conversely, retention barrel 108 may slide and/or move down relative to shoulder bolt 102 to decompress coil spring 110.

In some examples, retention barrel 108 may include and/or form another hole, channel, and/or opening through the wall, band, or ring that runs and/or composes the perimeter or boundary of retention barrel 108. In one example, the one hole and/or the other hole included in and/or formed by retention barrel 108 may be substantially perpendicular and/or orthogonal to one another. This other hole, channel, and/or opening may be threaded to accept a travel-limiting component (such as a set screw). For example, a set screw may be inserted laterally into retention barrel 108 far and/or deep enough to engage shoulder bolt 102 through retention barrel 108.

Retention barrel 108 may be of any suitable sizes, dimensions, and/or shapes. In one example, retention barrel 108 may be cylindrical in shape. In addition, retention barrel 108 may include and/or contain any of a variety of materials. Examples of such materials include, without limitation, metals, plastics, ceramics, polymers, composites, combinations or variations of one or more of the same, and/or any other suitable materials.

In some examples, coil spring 110 may include and/or represent any type or form of mechanical apparatus and/or device that stores and/or releases energy or force by way of one or more coils. Examples of coil spring 110 include, without limitation, compression springs, tension springs, extension springs, torsion springs, constant-force springs, combinations or variations of one or more of the same, and/or any other suitable springs.

In some examples, coil spring 110 may provide the necessary compression and/or load for a spring-loaded clamping assembly and/or system that secures and/or reinforces a thermal coupling between a heatsink and an electronic component (not illustrated in FIG. 1). In other words, coil spring 110 may, alone or together with other springs, ensure that the heatsink maintains sufficient thermal contact with its corresponding electronic component despite any non-coplanarity, warpage, deflection, and/or tolerances experienced during manufacturing. In addition, one or more coil springs may be applied to shoulder bolts pressed against a backplate to supply loads directly to the backplate instead of to the circuit board and/or substrate on which the electronic component is mounted, thereby alleviating some of the stress and/or strain placed on the circuit board and/or substrate.

Coil spring 110 may be of any suitable sizes, dimensions, and/or shapes. In some examples, coil spring 110 may each have a circular cross section. In one example, coil spring 110 may be sized in a particular way to envelop and/or fit properly over shoulder bolt 102. Additionally or alternatively, coil spring 110 may be sized in a particular way to squeeze and/or fit properly between head 104 of shoulder bolt 102 and the top lip, rim, or cup of retention barrel 108.

Coil spring 110 may include and/or contain a variety of materials. Examples of such materials include, without limitation, metals, copper, aluminum, alloys, plastics, combinations or variations of one or more of the same, and/or any other suitable materials.

In some examples, travel-limiting component 112 may include and/or represent any type or form of component that controls and/or limits the amount and/or distance that a heatsink is able to travel back and forth via coil spring 110. In one example, travel-limiting component 112 may include and/or represent a set screw that fits within the other hole, channel, and/or opening created and/or formed in the wall of retention barrel 108. In this example, the set screw may also include and/or form a thread that matches and/or corresponds to the one within the other hole, channel, and/or opening created and/or formed in the wall of retention barrel 108.

In one example, the set screw may be inserted into retention barrel 108 far and/or deep enough to engage shoulder bolt 102 through retention barrel 108. In this example, the set screw may effectively control the positioning of retention barrel 108 relative to shoulder bolt 102. Additionally or alternatively, the set screw may limit the amount of pressure and/or force with which a heatsink is applied to an electronic component (not illustrated in FIG. 1).

The set screw may be of any suitable sizes, dimensions, and/or shapes. In addition, the set screw may include and/or contain any of a variety of materials. Examples of such materials include, without limitation, metals, plastics, ceramics, polymers, composites, combinations or variations of one or more of the same, and/or any other suitable materials.

Figure 2:
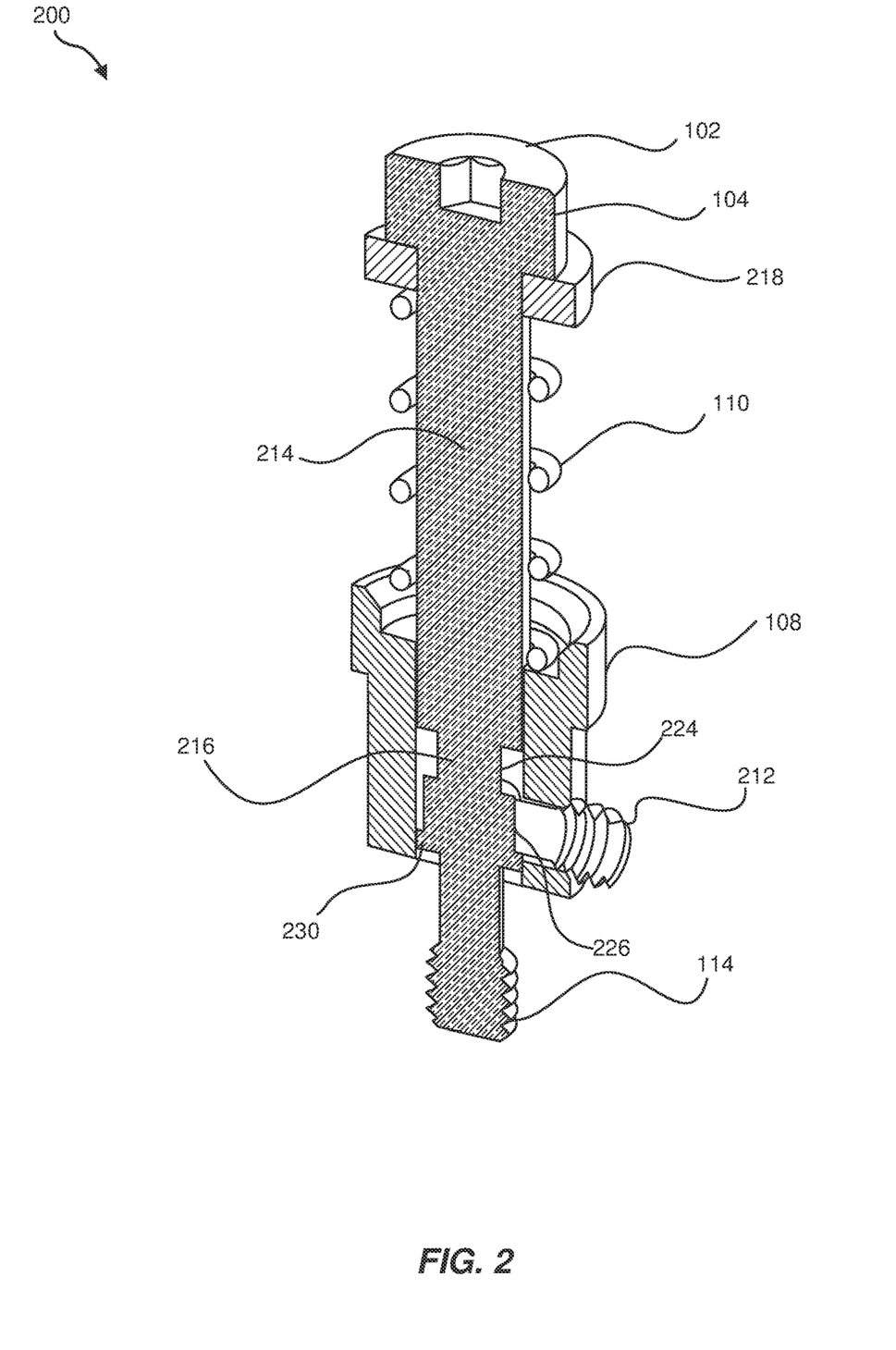
FIG. 2 is an illustration of an exemplary configuration of an apparatus for dynamic compensation of heatsink-clamping mechanisms.
Figure 3:
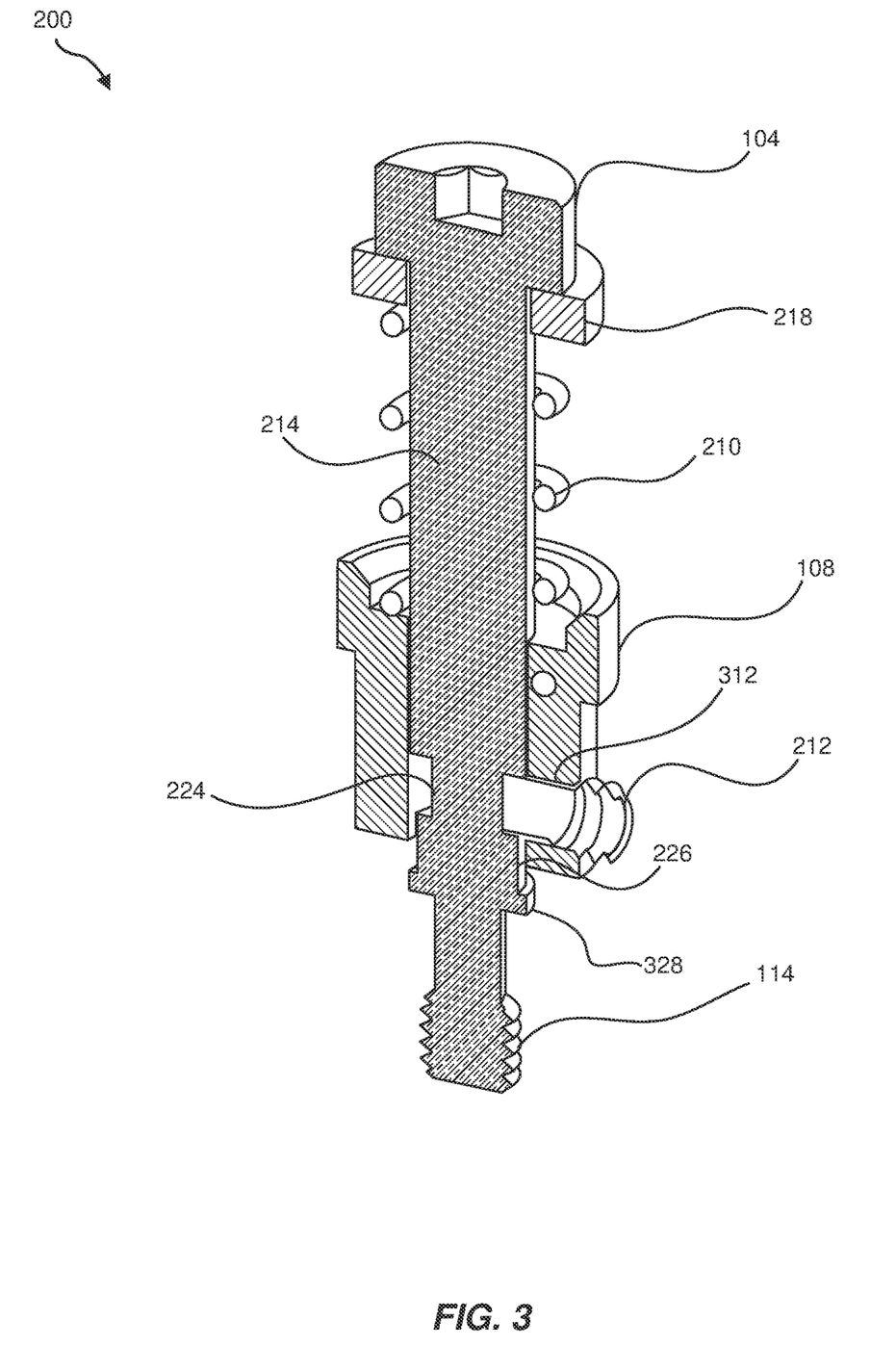
FIG. 3 is an illustration of an additional exemplary configuration of an apparatus for dynamic compensation of heatsink-clamping mechanisms.

FIGS. 2 and 3 illustrate cross-sectional views of certain configurations of an exemplary apparatus 200 for dynamic compensation of heatsink-clamping mechanisms. As illustrated in FIG. 2, exemplary apparatus 200 may include shoulder bolt 102, retention barrel 108, coil spring 110, and a set screw 212. In some examples, shank 106 of shoulder bolt 102 may include different sections, segments, and/or areas. For example, shank 106 may include an upper portion 214 enveloped by coil spring 110. In this example, shank 106 may also include a lower portion 216 enveloped by retention barrel 108.

In some examples, shank 106 may also include a proximal step 224 and a distal step 226. As illustrated in FIG. 2, distal step 226 may be located and/or positioned between proximal step 224 and thread 114 of shoulder bolt 102. In addition, proximal step 224 may be located and/or positioned between distal step 226 and head 104 of shoulder bolt 102. In one example, proximal step 224 and/or distal step 226 may each include and/or represent a groove and/or trough formed in shank 106 of shoulder bolt 102.

In one example, distal step 226 may represent and/or correspond to a pre-mount position, configuration, and/or setting. In this example, distal step 226 may be further away from the lengthwise center and/or core of shank 106 than proximal step 224. When apparatus 200 is set to this pre-mount position, configuration, and/or setting, set screw 212 may engage and/or rest against distal step 226. In one embodiment, shoulder bolt 102 may also include and/or form a lip 230 that abuts distal step 226 opposite proximal step 224 on shank 106. When apparatus 200 is set to this pre-mount position, configuration, and/or setting, set screw 212 may also engage and/or rest against lip 230 of shank 106.

In one example, proximal step 224 may represent and/or correspond to a post-mount position, configuration, and/or setting. In this example, proximal step 224 may be closer to the lengthwise center and/or core of shank 106 than distal step 226. When apparatus 200 is set to this post-mount position, configuration, and/or setting, set screw 212 may engage and/or rest against proximal step 224.

In some examples, the pre-mount position, configuration, and/or setting may enable a heatsink (not illustrated in FIG. 2) to travel and/or move axially or linearly via coil spring 110 at distances above a travel threshold. In contrast, the post-mount position, configuration, and/or setting may limit a heatsink (not illustrated in FIG. 2) from travelling and/or moving axially or linearly via coil spring 110 at distances above that travel threshold. In other words, the post-mount position, configuration, and/or setting may effectively block the heatsink from bouncing beyond that travel threshold. Accordingly, the pre-mount position may facilitate and/or allow for more travel and/or movement than the post-mount position. In other words, the pre-mount position may increase the travel threshold and/or capability of apparatus 200 relative to the post-mount position, and the post-mount position may decrease the travel threshold and/or capability of apparatus 200 relative to the pre-mount position.

In some examples, the pre-mount position may cause retention barrel 108 and head 104 of shoulder bolt 102 to compress coil spring 110 less than and/or below a compression threshold. Put differently, the pre-mount position may cause retention barrel 108 and head 104 of shoulder bolt 102 to decompress coil spring 110. In contrast, the post-mount position may cause retention barrel 108 and head 104 of shoulder bolt 102 to compress coil spring 110 more than and/or above the compression threshold.

Accordingly, FIG. 2 may represent, show, and/or demonstrate the pre-mount position of apparatus 200. For example, set screw 212 in FIG. 2 may engage and/or rest against distal step 226. In contrast, FIG. 3 may represent, show, and/or demonstrate the post-mount position of apparatus 200. For example, set screw 212 in FIG. 3 may engage and/or rest against proximal step 224.

Figure 4:
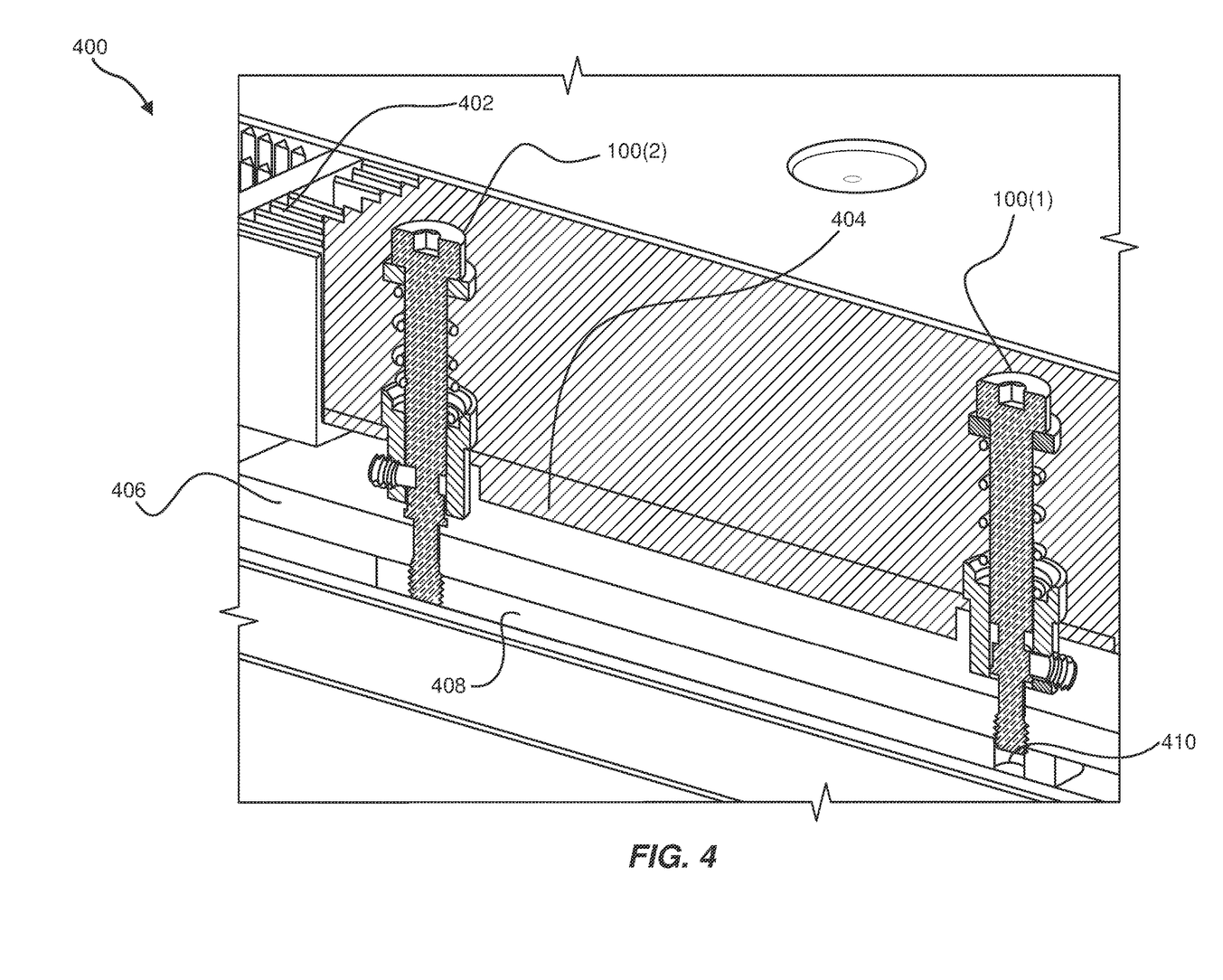
FIG. 4 is an illustration of an exemplary system or apparatus for dynamic compensation of heatsink-clamping mechanisms.

FIG. 4 illustrates an exemplary system 400 for dynamic compensation of heatsink-clamping mechanisms. As illustrated in FIG. 4, exemplary system 400 may include and/or represent apparatuses 100(1) and 100(2) coupled to a heatsink 402. In some examples, heatsink 402 may include and/or represent any type or form of system, device, structure, and/or mechanism that conducts, transfers, absorbs, and/or sinks heat.

Heatsink 402 may be of any suitable sizes, dimensions, and/or shapes. In one example, heatsink 402 to include and/or form a finned and/or pin fin structure. Additionally or alternatively, heatsink 402 may include and/or incorporate a pedestal 404 designed to make physical and/or thermal contact with an electronic component that generates heat. Heatsink 402 may include and/or contain any of a variety of conductive materials. Examples of such materials include, without limitation, copper, aluminum, copper, diamond, alloys of one or more of the same, combinations or variations of one or more of the same, and/or any other suitable materials.

In one example, apparatuses 100(1) and 100(2) may each represent and/or correspond to an instance of apparatus 100 in FIG. 1. Accordingly, apparatuses 100(1) and 100(2) in FIG. 4 may each include a shoulder bolt 102, a coil spring 110, a retention barrel 108, and a set screw 212 (even though these components are not explicitly labelled in FIG. 4).

Apparatuses 100(1) and 100(2) may each be coupled, mounted, and/or applied to heatsink 402 in a variety of different ways. For example, apparatuses 100(1) and 100(2) may each be secured and/or mounted to heatsink 402 by a press-fit fastening, an interference-fit fastening, and/or a friction-fit fastening. Additionally or alternatively, apparatuses 100(1) and 100(2) may each be secured and/or mounted to heatsink 402 by a slip-fit fastening. In further examples, apparatuses 100(1) and 100(2) may each be secured and/or mounted to heatsink 402 by a flange, a washer, and/or a nut.

As illustrated in FIG. 4, system 400 may also include a circuit board 406 to which heatsink 402 is secured and/or mounted. Heatsink 402 may be coupled, mounted, and/or applied to circuit board 406 in a variety of different ways. In one example, system 400 may further include a backplate 408 designed to secure and/or hold heatsink 402 against circuit board 406. In this example, circuit board 406 may reside and/or be located or positioned between heatsink 402 and backplate 408. In other words, heatsink 402 and backplate 408 may be positioned on opposite sides of circuit board 406 relative to one another.

In one example, backplate 408 may include and/or form a threaded receptacle 410 fitted for the thread of the shoulder bolt of apparatus 100(1) to which heatsink 402 is coupled. In this example, backplate 408 may include and/or form another threaded receptacle (not explicitly labelled in FIG. 4) fitted for the thread of the shoulder bolt of apparatus 100(2) to which heatsink 402 is coupled. Accordingly, the shoulder bolts of apparatuses 100(1) and 100(2) may be inserted and/or installed into the corresponding threaded receptacles of backplate 408 by rotating the shoulder bolts in a certain direction.

In other examples, in lieu of backplate 408, some systems and/or apparatuses may include and/or use a nut or a similar fastener (not illustrated in FIG. 4) designed to secure and/or hold heatsink 402 against circuit board 406. For example, one nut or similar fastener may include and/or form a threaded hole fitted for the thread of the shoulder bolt of apparatus 100(1) to which heatsink 402 is coupled. In this example, another nut or similar fastener may include and/or form another threaded hole fitted for the thread of the shoulder bolt of apparatus 100(2) to which heatsink 402 is coupled. Accordingly, the shoulder bolts of apparatuses 100(1) and 100(2) may be inserted and/or installed into the corresponding nuts or similar fasteners by rotating the shoulder bolts in a certain direction.

As illustrated in FIG. 4, apparatus 100(1) may be configured and/or set to the pre-mount position. For example, the set screw of apparatus 100(1) may engage and/or rest against the distal step on its shoulder bolt. In this example, the shoulder bolt of apparatus 100(1) is not yet fully inserted and/or installed into threaded receptacle 410 of backplate 408. In this post-mount position, apparatus 100(1) may facilitate, provide, and/or achieve decreased levels of pressure and/or force to heatsink 402. As a result, heatsink 402 may be able to account and/or compensate for inadvertent drops and/or vibrations during shipping and/or handling without damaging the electronic component to which heatsink 402 is applied.

To insert and/or install the shoulder bolt of apparatus 100(1) into threaded receptacle 410 of backplate 408, the shoulder bolt may be rotated and/or screwed in a certain direction. As the shoulder bolt is rotated and/or screwed in that direction, the set screw of apparatus 100(1) may dynamically transition and/or changeover from the distal step to the proximal step. For example, the shoulder bolt may continue to drive further into threaded receptacle 410 even though the retention barrel of apparatus 100(1) is stopped and/or blocked by circuit board 406. The resulting force and/or pressure may effectively push the set screw of apparatus 100(1) upward from the distal step to the proximal step.

When the shoulder bolt of apparatus 100(1) is inserted and/or installed into threaded receptacle 410 of backplate 408, apparatus 100(1) may dynamically transition and/or changeover from the pre-mount position to the post-mount position. Accordingly, the retention barrel of apparatus 100 (1) may press against circuit board 406, which resides between heatsink 402 and backplate 408. As a result, the retention barrel of apparatus 100(1) may, in conjunction with the head of the shoulder bolt, compress the coil spring, thereby limiting and/or reducing the amount of travel and/or movement of heatsink 402 relative to circuit board 406.

As illustrated in FIG. 4, apparatus 100(2) may be configured and/or set to the post-mount position. For example, the set screw of apparatus 100(2) may engage and/or rest against the proximal step on its shoulder bolt. In this example, the shoulder bolt of apparatus 100(2) is be fully inserted and/or installed into the corresponding receptacle of backplate 408. In this post-mount position, apparatus 100(2) may facilitate, provide, and/or achieve increased levels of pressure and/or force to heatsink 402. As a result, heatsink 402 may be able to satisfy and/or achieve the high thermal performance demands necessary for the corresponding electronic component(s) to function properly during operation.

Accordingly, when all the spring-loaded clamping mechanisms coupled to heatsink 402 are in the pre-mount position, these spring-loaded clamping mechanisms may provide decreased levels of pressure and/or force to heatsink 402. As a result, heatsink 402 may be able to account and/or compensate for inadvertent drops and/or vibrations during shipping and/or handling without damaging the electronic component to which heatsink 402 is applied. In contrast, when all the spring-loaded clamping mechanisms coupled to heatsink 402 are in the post-mount position, these spring-loaded clamping mechanisms may provide increased levels of pressure and/or force to heatsink 402. As a result, heatsink 402 may be able to satisfy and/or achieve the high thermal performance demands necessary for the corresponding electronic component(s) to function properly during operation.

Figure 5:
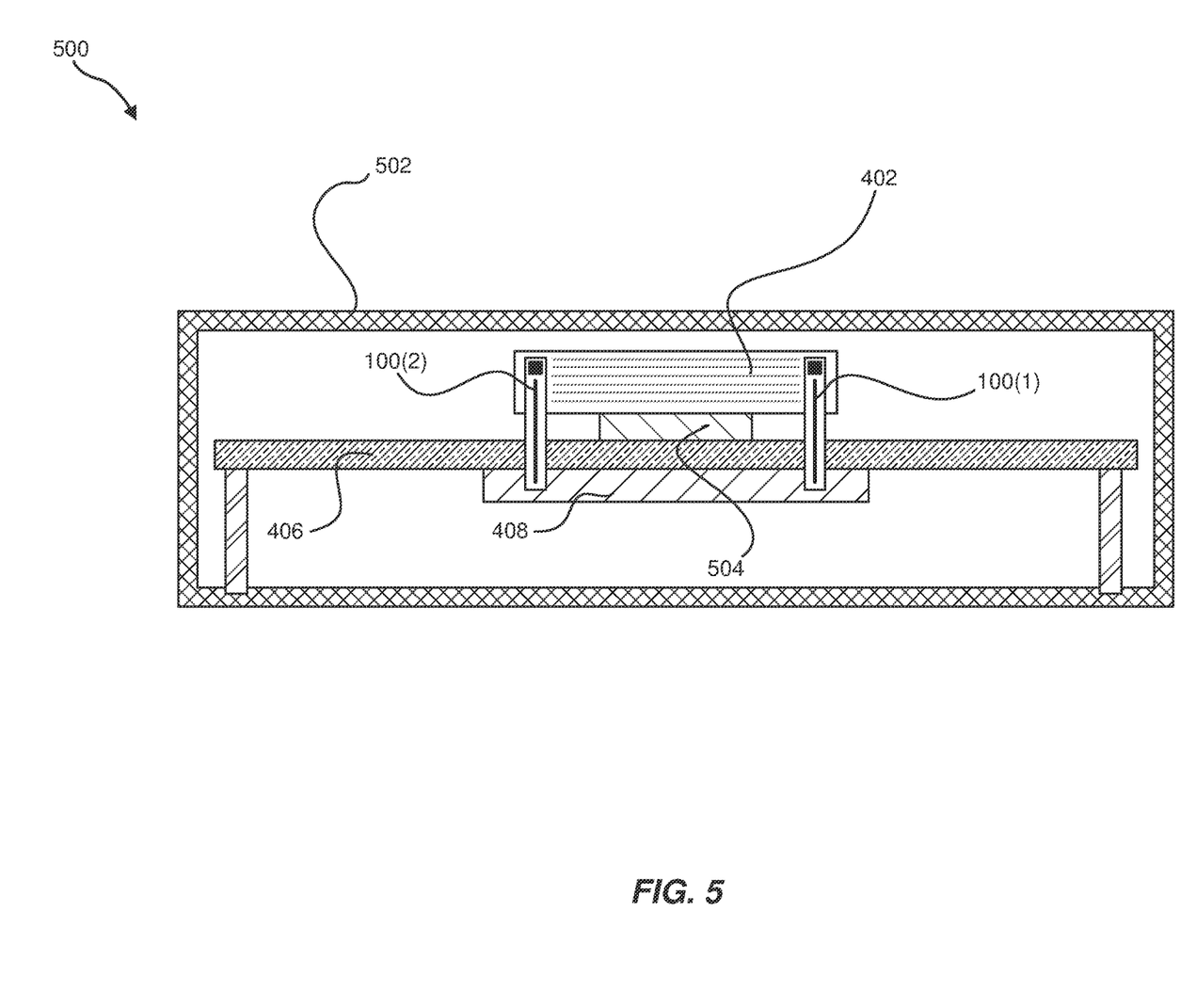
FIG. 5 is an illustration of an exemplary system or apparatus for dynamic compensation of heatsink-clamping mechanisms.

FIG. 5 illustrates an exemplary system 500 for dynamic compensation of heatsink-clamping mechanisms. As illustrated in FIG. 5, exemplary system 500 may include and/or represent heatsink 402 coupled to circuit board 406 by apparatuses 100(1) and 100(2) and backplate 408. In one example, circuit board 406 may include and/or incorporate an electronic component 504. In this example, electronic component 504 may be soldered to circuit board 406.

Examples of electronic component 504 include, without limitation, Application Specific Integrated Circuits (ASICs), integrated circuits, lidless integrated circuits, microprocessors, microcontrollers, Central Processing Units (CPUs), Field-Programmable Gate Arrays (FPGAs), memory devices, High Bandwidth Memory (HBM), Random Access Memory (RAM), Read Only Memory (ROM), flash memory, caches, portions of one or more of the same, variations or combinations of one or more of the same, and/or any other suitable component.

In one example, exemplary system 500 may also include an enclosure 502 of the device in which electronic component 504 and/or heatsink 402 is installed and/or operating. For example, enclosure 502 may include and/or represent the chassis of a telecommunications device (such as a router or switch). In this example, electronic component 504 and/or heatsink 402 may facilitate and/or contribute to the services and/or functionalities provided by the telecommunications device.

Figure 6:
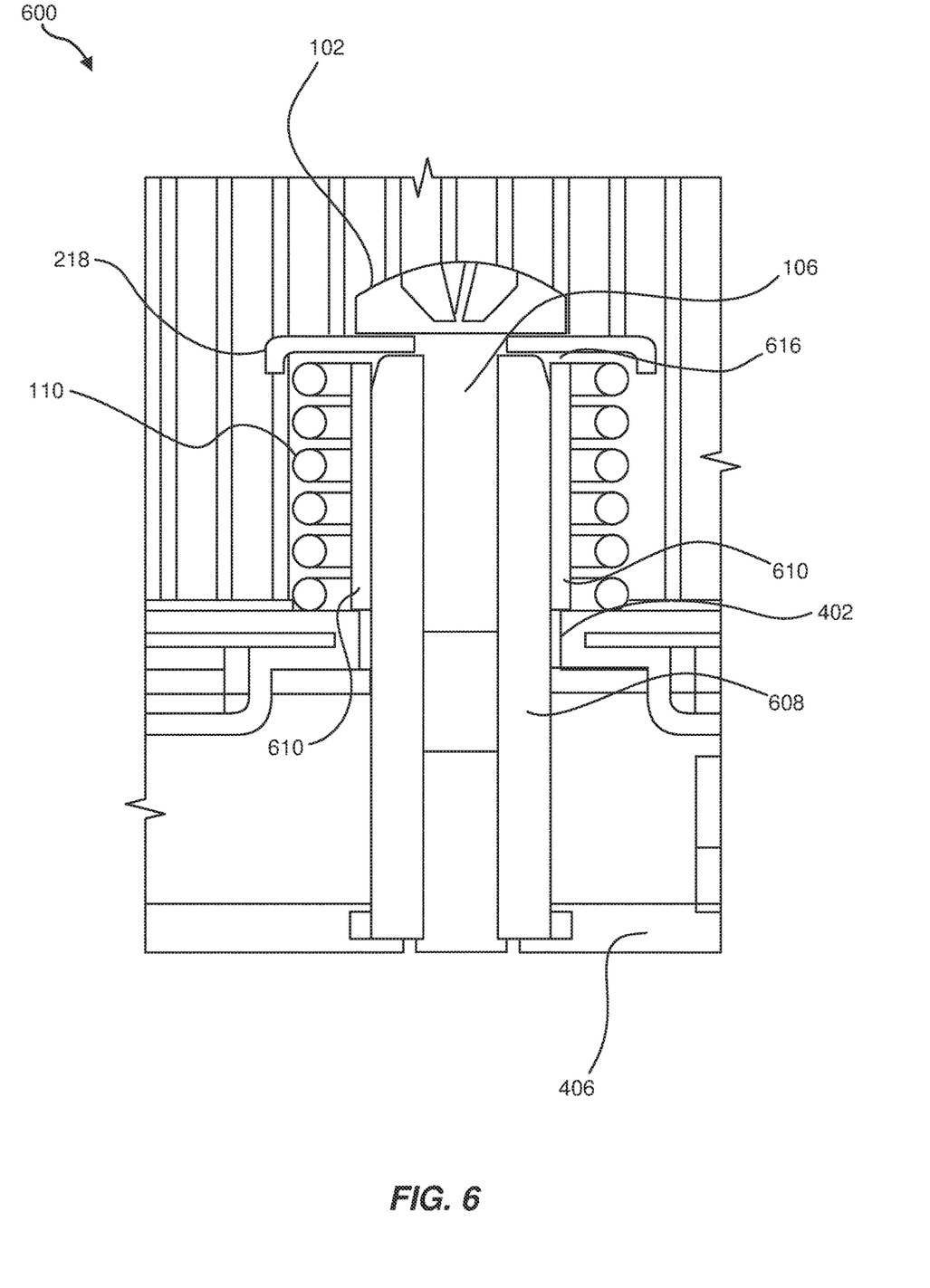
FIG. 6 is an illustration of an additional exemplary system or apparatus for dynamic compensation of heatsink-clamping mechanisms.

FIG. 6 illustrate an exemplary apparatus 600 for dynamic compensation of heatsink-clamping mechanisms. As illustrated in FIG. 6, exemplary apparatus 600 may include and/or represent shoulder bolt 102, coil spring 110, a retention barrel 608, and a travel-limiting component 610. In one example, retention barrel 608 may include and/or represent a standoff. Additionally or alternatively, retention barrel 608 may include and/or represent a press-fit and/or compression-fit interface. In this example, retention barrel 608 may serve and/or function to couple shoulder bolt 102 to circuit board 406.

As illustrated in FIG. 6, a portion of retention barrel 608 may partially envelop and/or fit over shank 106 of shoulder bolt 102. In this example, travel-limiting component 610 may partially envelop and/or fit over that portion of retention barrel 608. In one example, travel-limiting component 610 may include and/or represent a sleeve that at least partially covers that portion of retention barrel 608. In this example, the sleeve may be designed, measured, and/or configured to provide a design gap 616 in FIG. 6.

In some examples, the sleeve may reside and/or be located and/or positioned between flange washer 218 (or alternatively head 104 of shoulder bolt 102) and the base of heatsink 402. In such examples, design gap 616 may intentionally exist between the sleeve and flange washer 218. In one example, design gap 616 may account for and/or accommodate certain assembly tolerances. Accordingly, the sleeve may control and/or limit the upward and/or downward movement and/or travel of heatsink 402 to the distance allowed by design gap 616.

Figure 7:
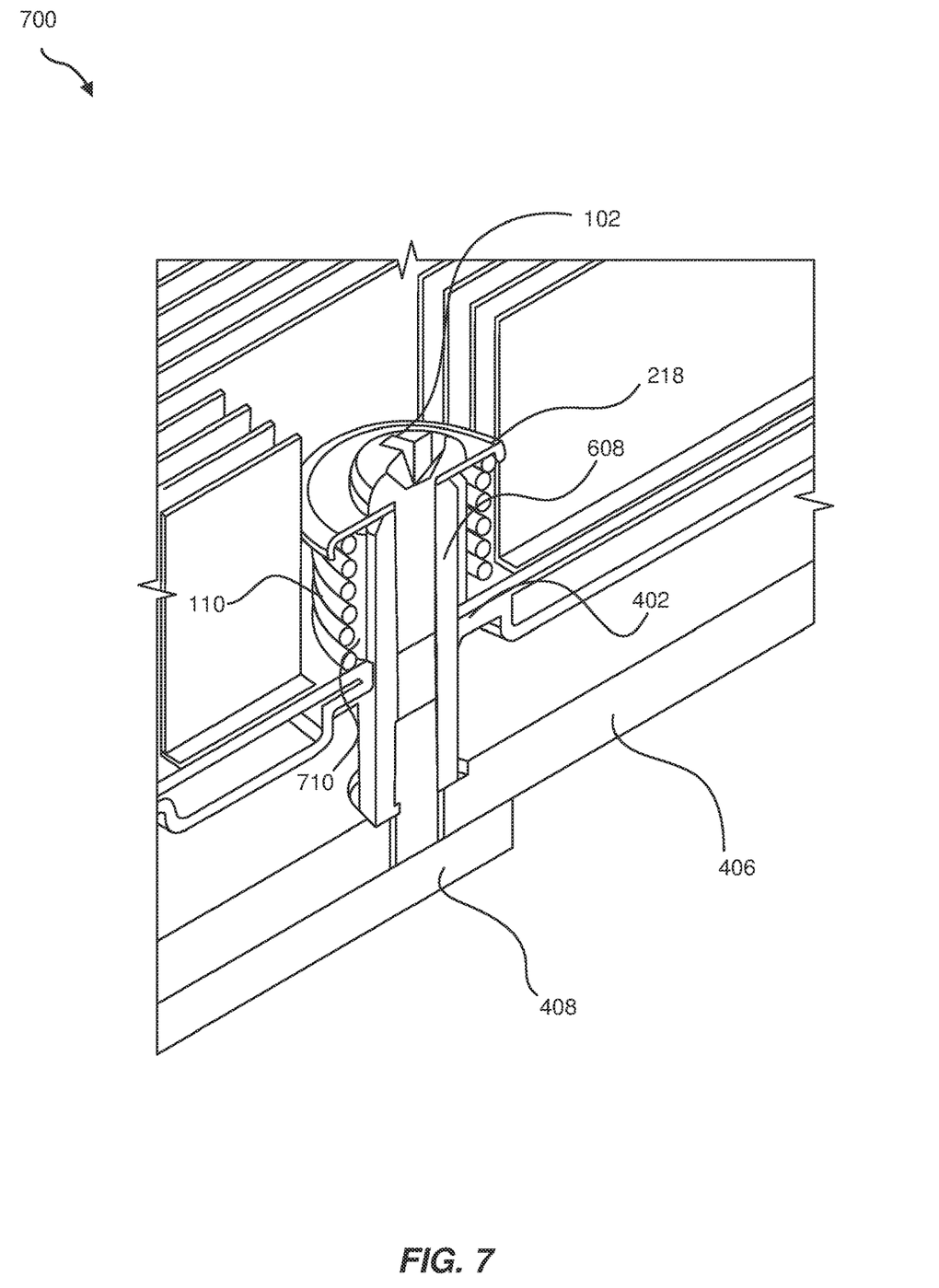
FIG. 7 is an illustration of an additional exemplary system or apparatus for dynamic compensation of heatsink-clamping mechanisms.

FIG. 7 illustrates an exemplary apparatus 700 for dynamic compensation of heatsink-clamping mechanisms. As illustrated in FIG. 7, exemplary apparatus 700 may include and/or represent shoulder bolt 102, flange washer 218, coil spring 110, retention barrel 608, and a travel-limiting sleeve 710. In addition, apparatus 700 may include and/or represent circuit board 406 and/or backplate 408. Apparatus 700 may be assembled and/or deployed in any of the ways described above in connection with FIGS. 1-6.

Figure 8:
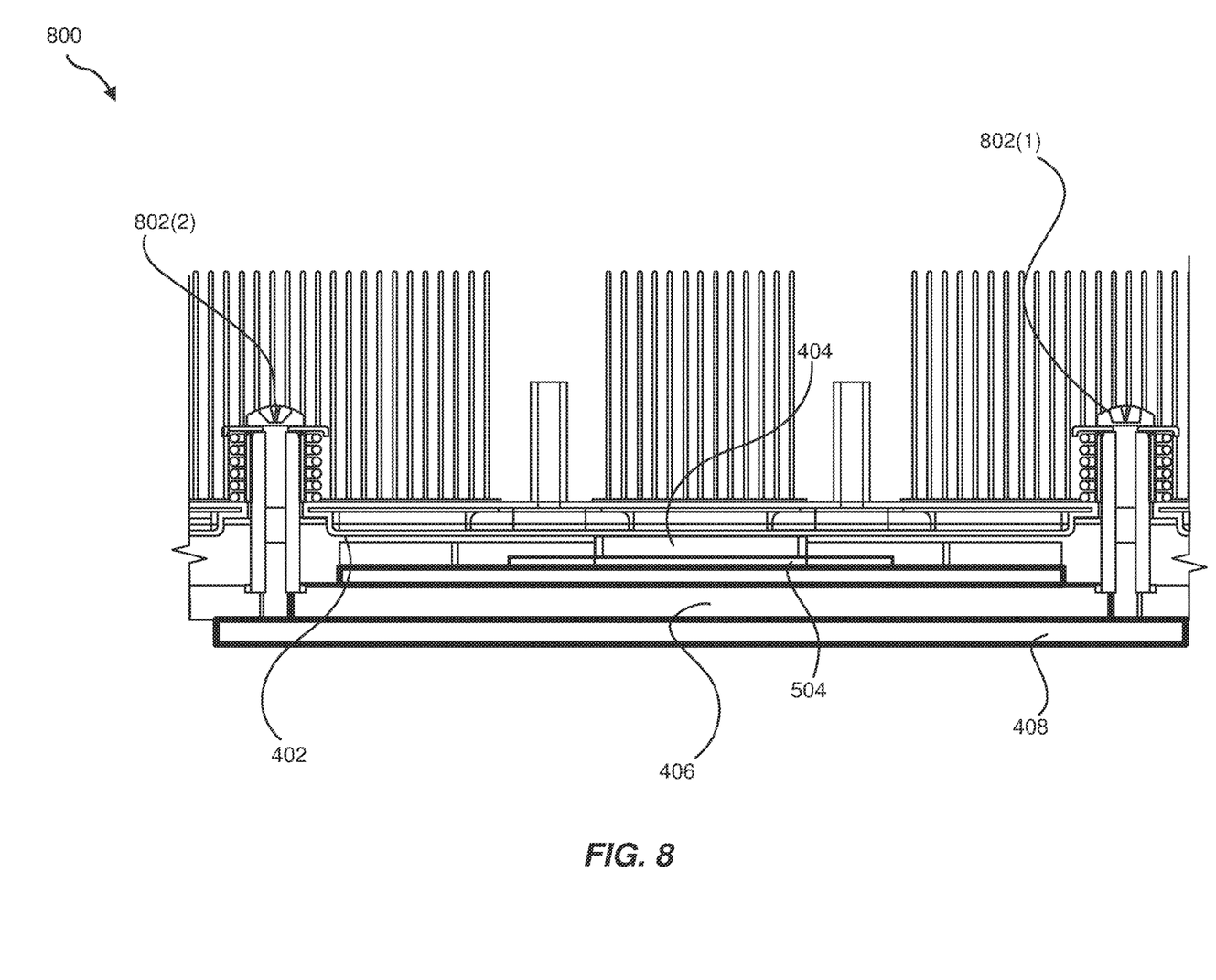
FIG. 8 is an illustration of an additional exemplary system or apparatus for dynamic compensation of heatsink-clamping mechanisms.

FIG. 8 illustrates an exemplary system 800 for dynamic compensation of heatsink-clamping mechanisms. As illustrated in FIG. 8, exemplary system 800 may include and/or represent heatsink 402, spring-loaded clamping mechanisms 802(1) and 802(2), circuit board 406, and/or backplate 408. In some examples, heatsink 402 may be coupled and/or secured to circuit board 406 by way of spring-loaded clamping mechanisms 802(1) and 802(2). In one example, spring-loaded clamping mechanisms 802(1) and 802(2) may each include and/or represent an instance of shoulder bolt 102, flange washer 218, coil spring 110, retention barrel 608, and/or travel-limiting sleeve 710. System 800 may be assembled and/or deployed in any of the ways described above in connection with FIGS. 1-7.

Figure 9:
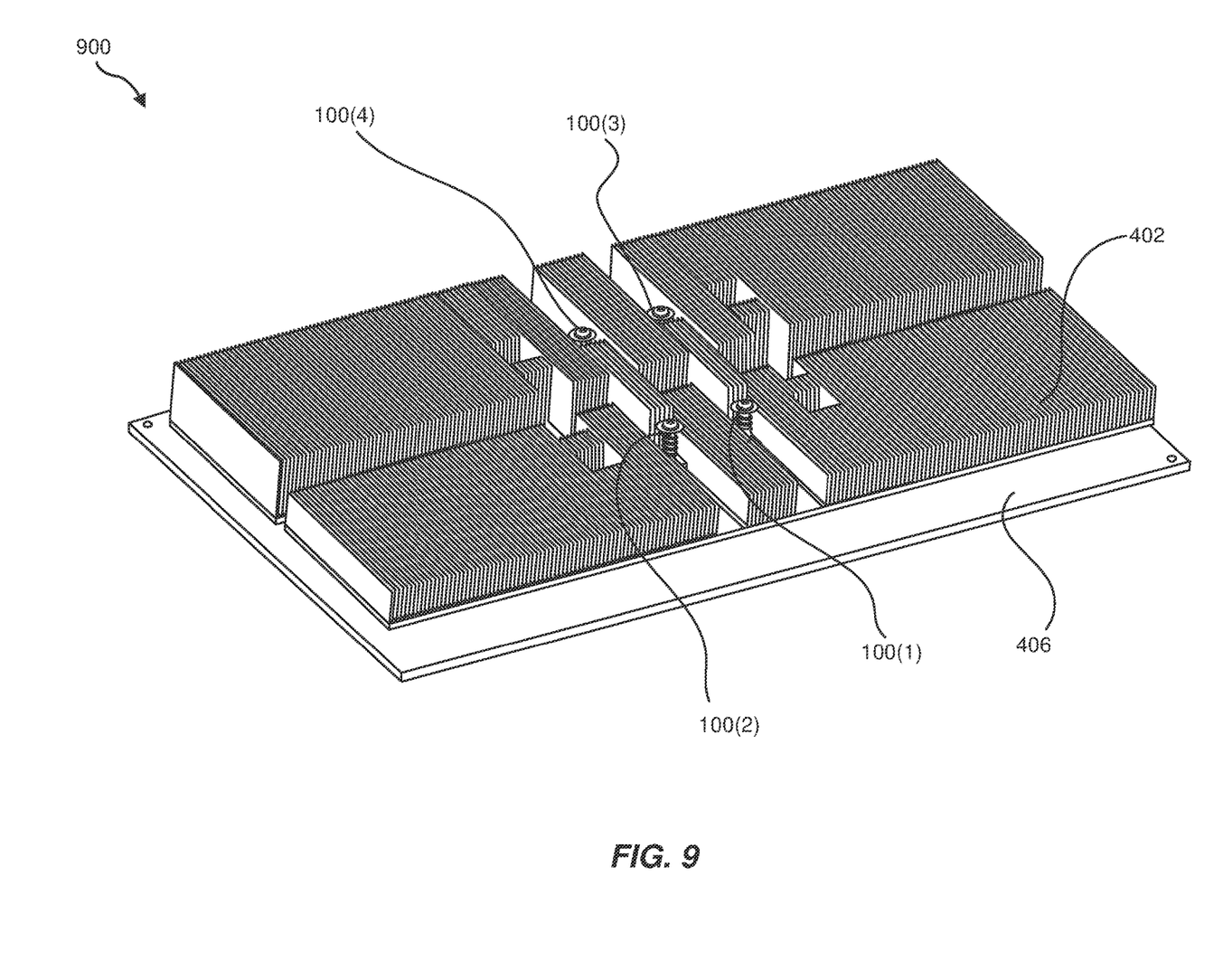
FIG. 9 is an illustration of an additional exemplary system or apparatus for dynamic compensation of heatsink-clamping mechanisms.

FIG. 9 illustrates an exemplary system 900 for dynamic compensation of heatsink-clamping mechanisms. As illustrated in FIG. 9, exemplary system 900 may include and/or represent heatsink 402, apparatuses 100(1), 100(2), 100(3), and 100(4), and circuit board 406. In some examples, heatsink 402 may be coupled and/or secured to circuit board 406 by way of apparatuses 100(1)-(4). System 900 may be assembled and/or deployed in any of the ways described above in connection with FIGS. 1-8.

Figure 10:
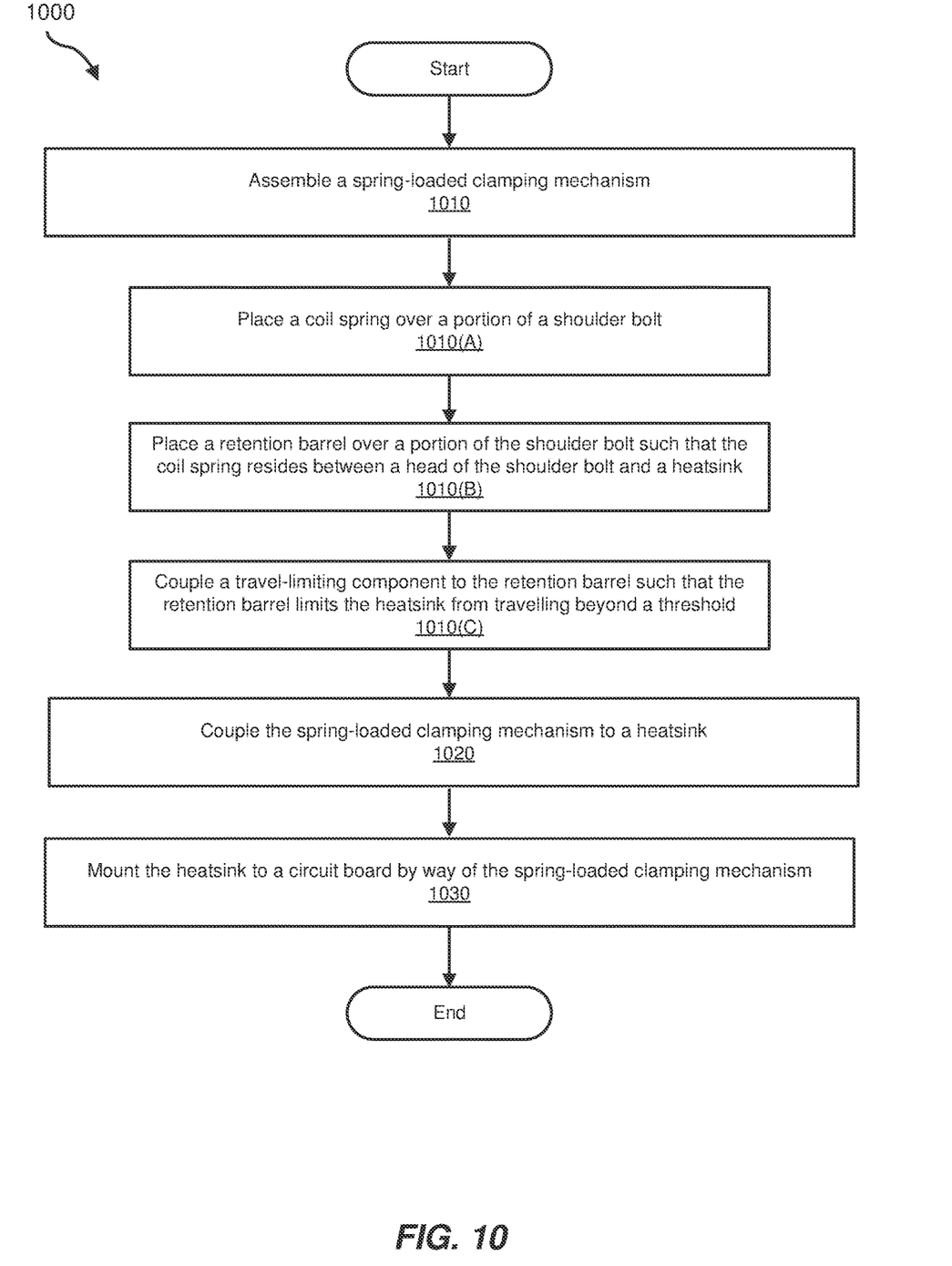
FIG. 10 is a flow diagram of an exemplary method for dynamic compensation of heatsink-clamping mechanisms.

FIG. 10 is a flow diagram of an exemplary method 1000 for dynamic compensation of heatsink-clamping mechanisms. Method 1000 may include the step of assembling a spring-loaded clamping mechanism (1010). Step 1010 may be performed in a variety of ways, including any of those described above in connection with FIGS. 1-9. For example, a spring-loaded clamping mechanism may be assembled by placing a coil spring over at least a portion of a shoulder bolt (1010(A)), placing a retention barrel over at least a portion of the shoulder bolt such that the coil spring resides between the head of the shoulder bolt and a heatsink (1010(B)), and coupling a travel-limiting component to the retention barrel such that the retention barrel limits the heatsink from travelling linearly beyond a travel threshold via the coil spring (1010(C)).

For example, a computing equipment manufacturer or subcontractor may assemble a spring-loaded clamping mechanism by placing a coil spring over at least a portion of a shoulder bolt. The shoulder bolt may include a head, a distal step, a proximal step, and a thread. In this example, the computing equipment manufacturer or subcontractor may also place a retention barrel (such as retention barrel 108 in FIG. 1 or retention barrel 608 in FIG. 6) over at least portion of the shoulder bolt such that the coil spring resides between the head of the shoulder bolt and a heatsink. Continuing with this example, the computing equipment manufacturer or subcontractor may further couple a travel-limiting component (such as set screw 212 in FIG. 2 or sleeve 710 in FIG. 7) to the retention barrel such that the retention barrel limits the heatsink from travelling linearly beyond a travel threshold via the coil spring.

Method 1000 may also include the step of coupling the spring-loaded clamping mechanism to a heatsink (1020). Step 1020 may be performed in a variety of ways, including any of those described above in connection with FIGS. 1-9. For example, the computing equipment manufacturer or subcontractor may attach, connect, and/or secure the spring-loaded clamping mechanism to the heatsink.

Method 1000 may further include the step of mounting the heatsink to a circuit board by way of the spring-loaded clamping mechanism (1030). Step 1030 may be performed in a variety of ways, including any of those described above in connection with FIGS. 1-9. For example, the computing equipment manufacturer or subcontractor may mount the heatsink to one side of a circuit board by way of the spring-loaded clamping mechanism. To do so, the computing equipment manufacturer or subcontractor may attach the spring-loaded mechanism to a backplate positioned on the opposite side of the circuit board. In some examples, this mounting may be accomplished via a press-fit, interference-fit, friction-fit, and/or compression-fit fastening or interface.

While the foregoing disclosure sets forth various embodiments using specific block diagrams, flowcharts, and examples, each block diagram component, flowchart step, operation, and/or component described and/or illustrated herein may be implemented, individually and/or collectively, using a wide range of hardware, software, or firmware (or any combination thereof) configurations. In addition, any disclosure of components contained within other components should be considered exemplary in nature since many other architectures can be implemented to achieve the same functionality.

The process parameters and sequence of the steps described and/or illustrated herein are given by way of example only and can be varied as desired. For example, while the steps illustrated and/or described herein may be shown or discussed in a particular order, these steps do not necessarily need to be performed in the order illustrated or discussed. The various exemplary methods described and/or illustrated herein may also omit one or more of the steps described or illustrated herein or include additional steps in addition to those disclosed.

The preceding description has been provided to enable others skilled in the art to best utilize various aspects of the exemplary embodiments disclosed herein. This exemplary description is not intended to be exhaustive or to be limited to any precise form disclosed. Many modifications and variations are possible without departing from the spirit and scope of the instant disclosure. The embodiments disclosed herein should be considered in all respects illustrative and not restrictive. Reference should be made to the appended claims and their equivalents in determining the scope of the instant disclosure.

Unless otherwise noted, the terms "connected to" and "coupled to" (and their derivatives), as used in the specification and claims, are to be construed as permitting both direct and indirect (i.e., via other elements or components) connection. In addition, the terms "a" or "an," as used in the specification and claims, are to be construed as meaning "at least one of." Finally, for ease of use, the terms "including" and "having" (and their derivatives), as used in the specification and claims, are interchangeable with and have the same meaning as the word "comprising."

What is claimed is:

1. An apparatus comprising:
   a shoulder bolt that includes:
      a head; and
      a shank;
   a retention barrel that envelops at least a portion of the shank of the shoulder bolt;
   a coil spring that envelops at least a portion of the shank of the shoulder bolt and resides between the head of the shoulder bolt and a heatsink; and
   a travel-limiting component that:
      is coupled to the retention barrel; and
      limits the heatsink from travelling linearly beyond a travel threshold via the coil spring; and
   wherein the retention barrel resides between the heatsink and the shank of the shoulder bolt.

2. The apparatus of claim 1, wherein the travel-limiting component comprises a set screw that is inserted laterally into a threaded hole formed in the retention barrel such that:
   the shoulder bolt and the set screw are oriented perpendicular to one another; and
   the set screw controls a positioning of the retention barrel relative to the shoulder bolt.

3. The apparatus of claim 2, wherein the heatsink is coupled to the retention barrel such that, when the shoulder bolt is mounted to a circuit board, the retention barrel secures the heatsink against an electronic component included on the circuit board.

4. The apparatus of claim 2, wherein the shoulder bolt further includes:
   a thread located opposite the head;
   a distal step on the shank; and
   a proximal step on the shank, wherein the proximal step is located between the distal step and the thread.

5. The apparatus of claim 4, further comprising a backplate that includes a threaded receptacle fitted for the thread of the shoulder bolt; and
   wherein:
      the heatsink is coupled to the shoulder bolt; and
      when the thread of the shoulder bolt is inserted into the threaded receptacle of the backplate, the retention barrel is pressed against a circuit board that resides between the heatsink and the backplate and, in conjunction with the head of the shoulder bolt, compresses the coil spring.

6. The apparatus of claim 5, wherein:
   the distal step on the shank corresponds to a pre-mount position in which:
      the coil spring is compressed below a compression threshold; and
      the set screw rests against the proximal step inside the retention barrel;
   the proximal step on the shank corresponds to a post-mount position in which:
      the coil spring is compressed above the compression threshold; and
      the set screw rests against the distal step inside the retention barrel.

7. The apparatus of claim 6, wherein:
   the pre-mount position increases the travel threshold relative to the post-mount position; and
   the post-mount position decreases the travel threshold relative to the pre-mount position.

8. The apparatus of claim 5, wherein:
   the shoulder bolt is inserted into the threaded receptacle by rotating the shoulder bolt in a certain direction; and
   as the shoulder bolt is rotated in the certain direction, the set screw transitions from the distal step to the proximal step along the shank of the shoulder bolt.

9. The apparatus of claim 5, further comprising:
   an additional shoulder bolt that includes:
      an additional head; and
      an additional shank;
   an additional retention barrel that envelops a lower portion of the additional shank of the additional shoulder bolt;
   an additional coil spring that envelops an upper portion of the additional shank of the additional shoulder bolt and resides between the additional head of the additional shoulder bolt and the additional retention barrel; and an additional set screw that is inserted laterally into an additional threaded hole formed in the additional retention barrel such that:
- the additional shoulder bolt and the additional set screw are oriented perpendicular to one another; and
- the additional set screw controls a positioning of the additional retention barrel relative to the additional shoulder bolt.

10. The apparatus of claim 9, wherein the heatsink is further coupled to the additional shoulder bolt such that, when the shoulder bolt and the additional shoulder bolt are mounted to the circuit board, the shoulder bolt and the additional shoulder bolt collectively secure the heatsink against an electronic component included on the circuit board.

11. The apparatus of claim 4, wherein the shoulder bolt further comprises a lip that abuts the distal step opposite the proximal step on the shank.

12. The apparatus of claim 4, wherein the proximal step comprises a groove formed in the shank of the shoulder bolt.

13. The apparatus of claim 1, wherein the travel-limiting component comprises a sleeve that covers at least a portion of the shank of the shoulder bolt and resides between the retention barrel and the coil spring.

14. The apparatus of claim 1, further comprising a flange washer that resides between the head of the shoulder bolt and the coil spring and holds the coil spring between the head of the shoulder bolt and the retention barrel.

15. The apparatus of claim 1, wherein at least one of:
- the portion of the shank of the shoulder bolt enveloped by the retention barrel is identical to the portion of the shank of the shoulder bolt enveloped by the coil spring; or
- the portion of the shank of the shoulder bolt enveloped by the retention barrel is different than the portion of the shank of the shoulder bolt enveloped by the coil spring.

16. A system comprising:
a heatsink; and
a spring-loaded clamping mechanism for securing the heatsink to an electronic component included on a circuit board, wherein the spring-loaded clamping mechanism comprises:
- a shoulder bolt coupled to the heatsink, wherein the shoulder bolt includes:
  - a head; and
  - a shank;
- a retention barrel that envelops at least a portion of the shank of the shoulder bolt and resides between the heatsink and the shank of the shoulder bolt;
- a coil spring that envelops at least a portion of the shank of the shoulder bolt and resides between the head of the shoulder bolt and the heatsink; and
- a travel-limiting component that:
  - is coupled to the retention barrel; and
  - limits the heatsink from travelling linearly beyond a travel threshold via the coil spring.

17. The system of claim 16, wherein the travel-limiting component comprises a set screw that is inserted laterally into a threaded hole formed in the retention barrel such that:
- the shoulder bolt and the set screw are oriented perpendicular to one another; and
- the set screw controls a positioning of the retention barrel relative to the shoulder bolt.

18. The system of claim 17, wherein the heatsink is coupled to the retention barrel such that, when the shoulder bolt is mounted to the circuit board, the retention barrel secures the heatsink against the electronic component included on the circuit board.

19. The system of claim 16, wherein the travel-limiting component comprises a sleeve that covers at least a portion of the shank of the shoulder bolt and resides between the retention barrel and the coil spring.

20. A method comprising:
assembling a spring-loaded clamping mechanism by:
- placing a coil spring over at least a portion of a shoulder bolt;
- placing a retention barrel over at least a portion of the shoulder bolt such that the coil spring resides between a head of the shoulder bolt and a heatsink and the retention barrel resides between the heatsink and the shank of the shoulder bolt; and
- coupling a travel-limiting component to the retention barrel such that the retention barrel limits the heatsink from travelling linearly beyond a travel threshold via the coil spring;

coupling the spring-loaded clamping mechanism to the heatsink; and mounting the heatsink to one side of a circuit board by way of the spring-loaded clamping mechanism by attaching the spring-loaded clamping mechanism to a backplate positioned on an opposite side of the circuit board.

* * * * *